United States Patent [19]
Shimazu

[11] Patent Number: 6,142,773
[45] Date of Patent: Nov. 7, 2000

[54] ENVELOPING DEVICE AND VERTICAL HEAT-TREATING APPARATUS FOR SEMICONDUCTOR PROCESS SYSTEM

[75] Inventor: Tomohisa Shimazu, Sagamihara, Japan

[73] Assignee: Tokyo Electron Limited, Tokyo, Japan

[21] Appl. No.: 09/375,466

[22] Filed: Aug. 17, 1999

[30] Foreign Application Priority Data

Aug. 19, 1998  [JP]  Japan .................................. 10-232166

[51] Int. Cl.[7] ...................................................... F27D 3/12
[52] U.S. Cl. ........................ 432/241; 432/242; 432/152; 277/614; 277/637; 277/914; 118/733
[58] Field of Search ................................. 432/241, 5, 6, 432/11, 152, 242; 34/242; 277/913, 614, 634, 637; 118/733

[56] References Cited

U.S. PATENT DOCUMENTS 5,533,736   7/1996   Yamaga .................................... 277/637

FOREIGN PATENT DOCUMENTS 5-355264   12/1993   Japan .
7-29841    1/1995    Japan .
7-45549    2/1995    Japan .
7-45624    2/1995    Japan .

*Primary Examiner*—Pamela Wilson
*Assistant Examiner*—Jiping Lu
*Attorney, Agent, or Firm*—Oblon, Spivak, McClelland, Maier & Neustadt, P.C.

[57] ABSTRACT

The process tube of a vertical heat-treating apparatus for semiconductor wafers has a port at the bottom to be opened and closed by a lid. A sealing mechanism is arranged to seal the connecting portion between the flange of the port and the flange of the lid. The flanges are provided with annular mirror surfaces on the inner side, which face and contact each other to form an inner seal. The flanges are also provided with annular counter surfaces on the outer side, which face each other with a gap therebetween. A metal sheet member is arranged in the gap such that an outer seal is formed by the metal sheet member and the counter surfaces. The metal sheet member has sheets vacuum-stuck onto the counter surfaces, respectively. A buffer space is formed between the inner and outer seals, and is vacuum-exhausted by an exhaust unit.

13 Claims, 4 Drawing Sheets

ENVELOPING DEVICE AND VERTICAL HEAT-TREATING APPARATUS FOR SEMICONDUCTOR PROCESS SYSTEM

BACKGROUND OF THE INVENTION

The present invention relates to an enveloping device and a vertical heat-treating apparatus for a semiconductor process system, and particularly to a heat-treating apparatus which is capable of performing processes, such as oxidation, diffusion, and CVD (Chemical Vapor Deposition), in series. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In a process of manufacturing a semiconductor device, various kinds of heat-treating apparatuses are used for subjecting a semiconductor wafer to processes, such as oxidation, diffusion, CVD, and annealing. The heat-treating apparatuses are roughly categorized into two types, i.e., a single-substrate-processing type in which wafers are processed one by one in a process chamber, and a batch-processing type, which is of a horizontal type or a vertical type, in which wafers are processed all together in a process chamber.

For example, a vertical CVD apparatus of the batch-processing type employs a vertically long process chamber for accommodating a boat in which a number of wafers are stacked with a gap therebetween. The process chamber is constituted of a cylindrical reaction tube or process tube made of quartz and a cylindrical manifold made of a metal, which is attached to the bottom of the reaction tube and has a gas inlet and a gas outlet. The manifold is provide with a port at its bottom, through which the wafer boat is loaded and unloaded to and from the reaction tube, while the wafer boat is supported on a metal lid for opening and closing the port. O-rings are used for connecting portions of the parts constituting the process chamber to ensure that the process chamber is highly airtight.

On the other hand, a vertical diffusion or oxidation apparatus of the batch-processing type also employs a vertically long process chamber for accommodating a wafer boat. The process chamber is constituted of a reaction tube made of quartz having a gas inlet and a gas outlet on its side wall. The reaction tube is provide with a port at its bottom, through which the wafer boat is loaded and unloaded to and from the reaction tube, and a quartz lid for opening and closing the port. In other words, the process chamber is entirely made of quartz to ensure that the process chamber is highly heat-resistant and highly corrosion-resistant.

The CVD apparatus described above is capable of handling a process using a high vacuum condition, but does not suit a process using a high temperature or a corrosive gas, because the apparatus employs several O-rings and the metal manifold. On the other hand, the diffusion or oxidation apparatus described above is capable of handling a process using a high temperature or a corrosive gas, but does not suit a process using a high vacuum condition, because the apparatus is not highly airtight.

Accordingly, where processes of oxidation, diffusion, and CVD are to be performed in series in a conventional semiconductor process system, heat-treating apparatuses respectively dedicated to the different processes have to be arranged. In this case, a wafer has to be transferred among the apparatuses for respective processes, thereby entailing a waste of time as well as degradation in the quality of a film formed on the wafer.

BRIEF SUMMARY OF THE INVENTION

An object of the present invention is to provide an enveloping device for a semiconductor process system, which can be adapted to various kinds of conditions.

Another object of the present invention is to provide a vertical heat-treating apparatus for a semiconductor process system, which allows processes each using a heat treatment, such as oxidation, diffusion, and CVD, to be performed in series in the apparatus.

According to a first aspect of the present invention, there is provided an enveloping device having a sealing mechanism for a semiconductor process system, comprising:

a casing having first and second parts detachably assembled to envelop a pressure-reduced space;

a member configured to apply a mechanical force to join the first and second parts;

a first flange arranged on the first part, and being provided with a looped first mirror surface, and a looped first counter surface arranged around the first mirror surface, the first mirror surface having a surface roughness of Ra (mean surface roughness)=0.06 µm or less;

a second flange arranged on the second part, and being provided with a looped second mirror surface, and a looped second counter surface arranged around the second mirror surface, the second mirror surface having a surface roughness of Ra=0.06 µm or less, the first and second mirror surfaces facing and contacting each other to form an inner seal for substantially airtightly sealing the pressure-reduced space, the first and second counter surfaces facing each other with a gap therebetween;

a looped seal member arranged in the gap such that an outer seal is formed by the first and second counter surfaces and the seal member, and a looped buffer space, substantially airtightly closed, is formed between the inner and outer seals; and a buffer exhaust mechanism configured to exhaust and set the buffer space to a pressure-reduced state.

According to a second aspect of the present invention, there is provided a vertical heat-treating apparatus for subjecting a plurality of target substrates to a heat treatment at the same time in a semiconductor process system, comprising:

a process tube forming a pressure-reduced process space for accommodating the target substrates, and having a port at a bottom for loading and unloading the target substrates, and a first flange surrounding the port, the first flange being provided with a looped first mirror surface, and a looped first counter surface arranged around the first mirror surface, the first mirror surface having a surface roughness of Ra=0.06 µm or less;

a lid configured to open and close the port, and having a second flange for sealing the process space in cooperation with the first flange, the second flange being provided with a looped second mirror surface, and a looped second counter surface arranged around the second mirror surface, the second mirror surface having a surface roughness of Ra=0.06 µm or less, the first and second mirror surfaces facing and contacting each other to form an inner seal for substantially airtightly sealing the process space, the first and second counter surfaces facing each other with a gap therebetween;

a looped seal member arranged in the gap, and having a looped first sheet in contact with the first counter surface, a looped second sheet in contact with the second counter surface, and a looped connecting portion airtightly connecting the first and second sheets to each other, such that an outer seal is formed by the first and second counter surfaces and the seal member, and a looped buffer space, substantially airtightly closed, is formed between the inner and outer seals;

a suction mechanism configured to vacuum-stick the first and second sheets onto the first and second counter surfaces, respectively, and including suction holes formed in the first and second flanges to have openings corresponding to the first and second sheets, respectively;

a buffer exhaust mechanism configured to exhaust and set the buffer space to a pressure-reduced state;

a holder configured to hold the target substrates to be stacked with a gap therebetween in the process tube, the holder being loaded and unloaded to and from the process tube through the port while holding the target substrates;

an elevating mechanism configured to move up and down the lid along with the holder, the second flange of the lid being pressed against the first flange of the process tube by the elevating mechanism;

a heater configured to heat the process tube and arranged around the process space;

a supply mechanism configured to supply a process gas into the process space; and a main exhaust mechanism configured to exhaust and set the process space to a pressure-reduced state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
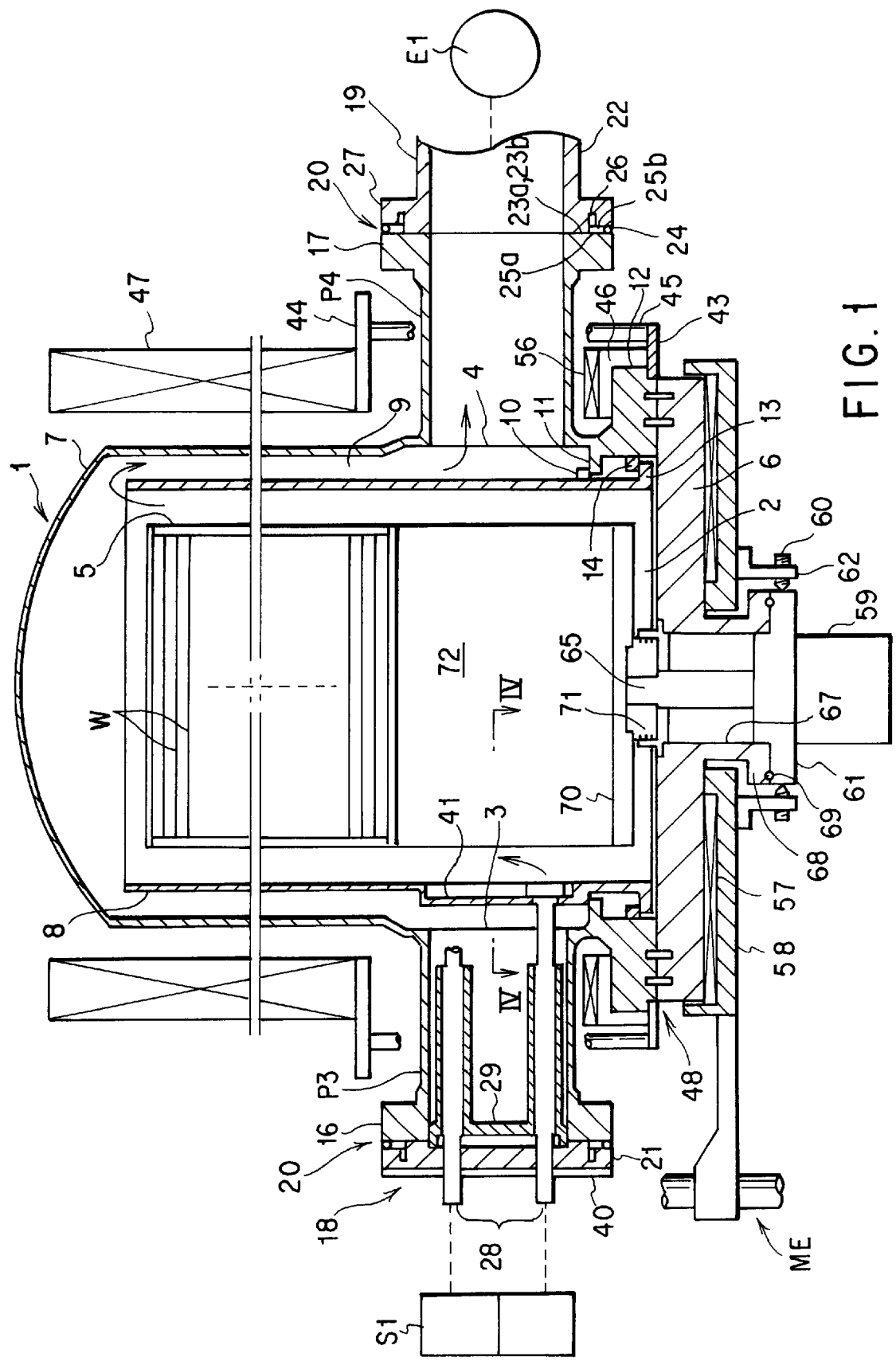
FIG. 1 is a constitutional view mainly showing a vertical cross-section of the main part of a vertical heat-treating apparatus according to an embodiment of the present invention.

As shown in FIG. 1, a vertical heat-treating apparatus includes a process chamber 1 which has a port 2 formed at the bottom for loading and unloading a boat 5 holding a number of semiconductor wafers. The port 2 is opened and closed by a lid 6 which is vertically moved by an elevating mechanism ME. For example, 150 wafers are supported in the boat 5 such that they are stacked with a gap therebetween. A gas inlet 3 is formed in the side wall of the process chamber 1 and connected to a gas supply unit S1 for supplying process gases into the process chamber 1. A gas outlet 4 is also formed in the side wall of the process chamber 1 and connected to a main exhaust unit E1 for exhausting the process chamber 1 and setting it to a vacuum.

The process chamber 1 has a double-tube structure consisting of an outer tube 7 and an inner tube 8 arrange concentric with each other and each formed of a vertically long cylinder which is made of a heat-resistant and corrosion-resistant material, such as quartz. The outer tube 7 essentially forms a reaction tube which has a closed top and an open bottom. The inner tube 8 has an open top and an open bottom. Accordingly, a gas passage is formed in the process chamber 1 such that a process gas flows upward from the bottom of the inner tube 8 and is used for processing the wafers W, and then flows downward through an annular space 9 between the inner and upper tubes 8 and 7 and is exhausted.

Figure 4:
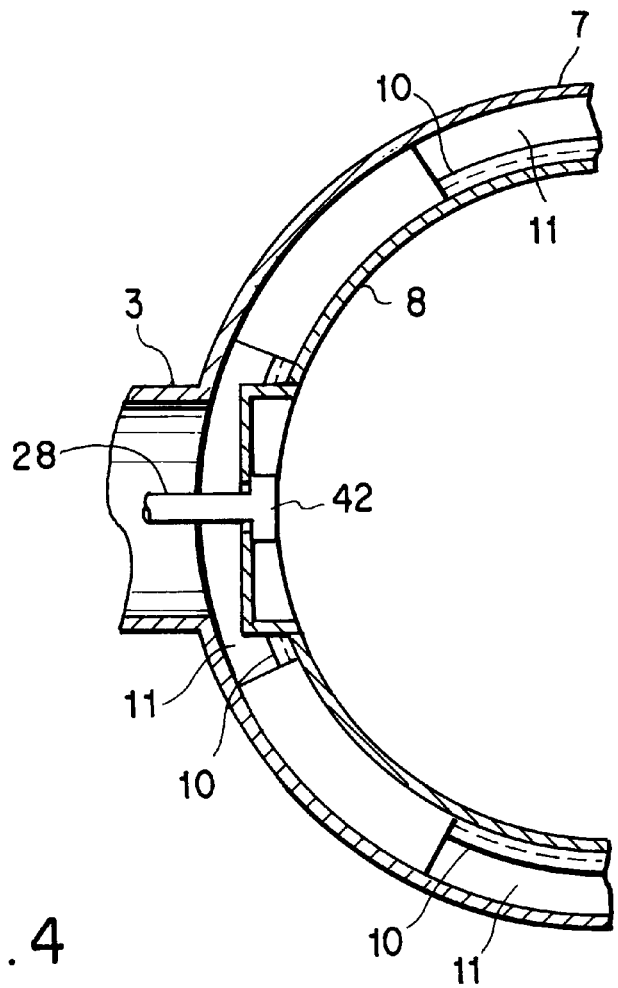
FIG. 4 is a cross-sectional view schematically showing the part cut along line IV—IV in FIG. 1.

In order to detachably arrange the inner and outer tubes 8 and 7, a bayonet coupling structure is employed. Specifically, as shown in FIG. 4, the outer surface of the inner tube 8 and the inner surface of the outer tube 7 are provided with engaging fins 10 and 11 arranged at intervals in the angular direction, so that the fins 10 and 11 can selectively overlap and engage with each other. When the engaging fins 10 of the inner tube 8 are positioned between the engaging fins 11 of the outer tube 7 by rotating the inner tube 8 by a certain angle, the engagement between the fins 10 and 11 is released, so that the inner tube 8 can be detached from the outer tube 7. The engaging fins 10 and 11 are preferably arranged at positions below the gas inlet 3 and gas outlet 4.

Figure 5:
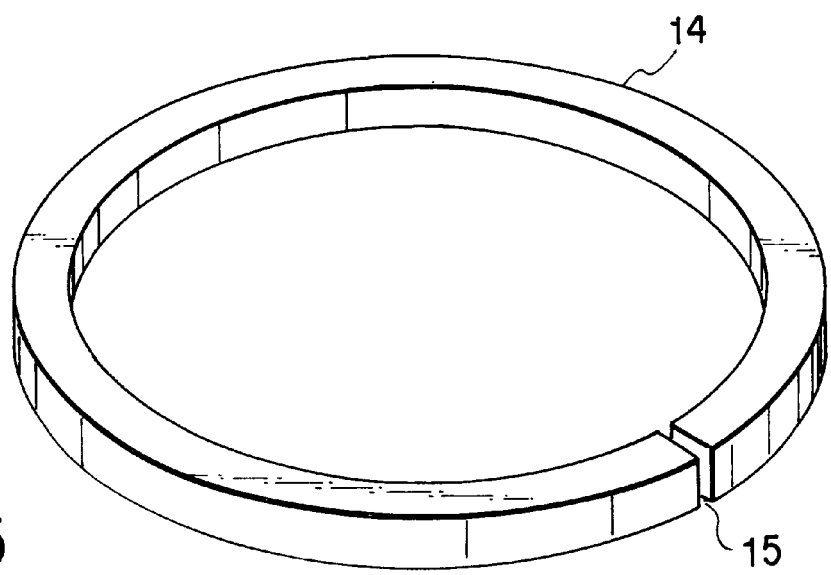
FIG. 5 is a perspective view showing an annular seal ring for sealing an annular space formed between outer and inner tubes of the apparatus shown in FIG. 1.

The outer and inner tubes 7 and 8 are provided with outward flanges 12 and 13, respectively, at the bottom. A seal ring 14 is arranged at the bottom of the annular space 9 between the outer and inner tubes 7 and 8 to seal the annular space 9, so that a process gas is not allowed to leak downward from the annular space 9. As shown in FIG. 5, the seal ring 14 has a C-shape with a cut 15 in the plan view, so that it can come into contact with the inside of the outer tube 7 with a spring-like force.

The annular space 9 between the outer and inner tubes 7 and 8 is sealed by the seal ring 14 wherein the ring 14 is in contact with the inside of the outer tube 7 and is also in contact with the top surface of the flange 13 of the inner tube 8 by its own weight. A weight may be disposed on top of the seal ring 14, so that the seal ring 14 is pressed against the top surface of the flange 13 of the inner tube 8. When the seal ring 14 is attached in the outer tube 7, the cut 15 becomes so small that leakage of a process gas through the cut 15 does not affect the process.

In this embodiment, the outer and inner tubes 7 and 8, the lid 6, and the seal ring 14 are all made of quartz. However, each of these members may be made of a material selected from the group consisting of silicon oxide (including quarts), silicon carbide, zirconium oxide, and aluminum oxide.

Piping portions P3 and P4 formed integrally with the outer tube 7 extend from the side wall of the outer tube 7. The piping portions P3 and P4 communicate with the gas inlet 3 for supplying process gases into the process chamber 1, and the gas outlet 4 for exhausting the process chamber 1, respectively. The piping portions P3 and P4 of the gas inlet and outlet 3 and 4 are provided with flanges 16 and 17, respectively, at the distal ends. The piping portion P3 of the gas inlet 3 is connected to the gas supply unit S1 through a gas introducing structure 18. The piping portion P4 of the gas outlet 4 is connected through an exhaust line 19 to the main exhaust unit E1 including a vacuum pump which is capable of reducing the pressure within the process chamber 1 down to about $10^{-8}$ Torr.

Between the piping portion P3 and the gas introducing structure 18, and between the piping portion P4 and the exhaust line 19, sealing mechanisms 20 of a first type for ensuring an airtight connection are respectively arranged. On the gas inlet 3 side, the first type sealing mechanism 20 is arranged between the flange 16 of the piping portion P3 of the gas inlet 3 and a flange 21a of an end plate 21 of the gas introducing structure 18, which are mechanically joined by a plurality of screws BS (see FIG. 2). On the gas outlet 4 side, the first type sealing mechanism 20 is arranged between the flange 17 of the piping portion P4 of the gas outlet 4 and a flange 27 of the exhaust line 19, which are mechanically joined by a plurality of screws. Instead of the screws, a clamp for sandwiching two flanges may be used for mechanically joining the flanges. Because the two sealing mechanisms 20 of the first type respectively arranged on the gas inlet 3 side and the gas outlet 4 side have substantially the same structure, only the mechanism 20 on the gas inlet 3 side will be explained below.

Figure 2:
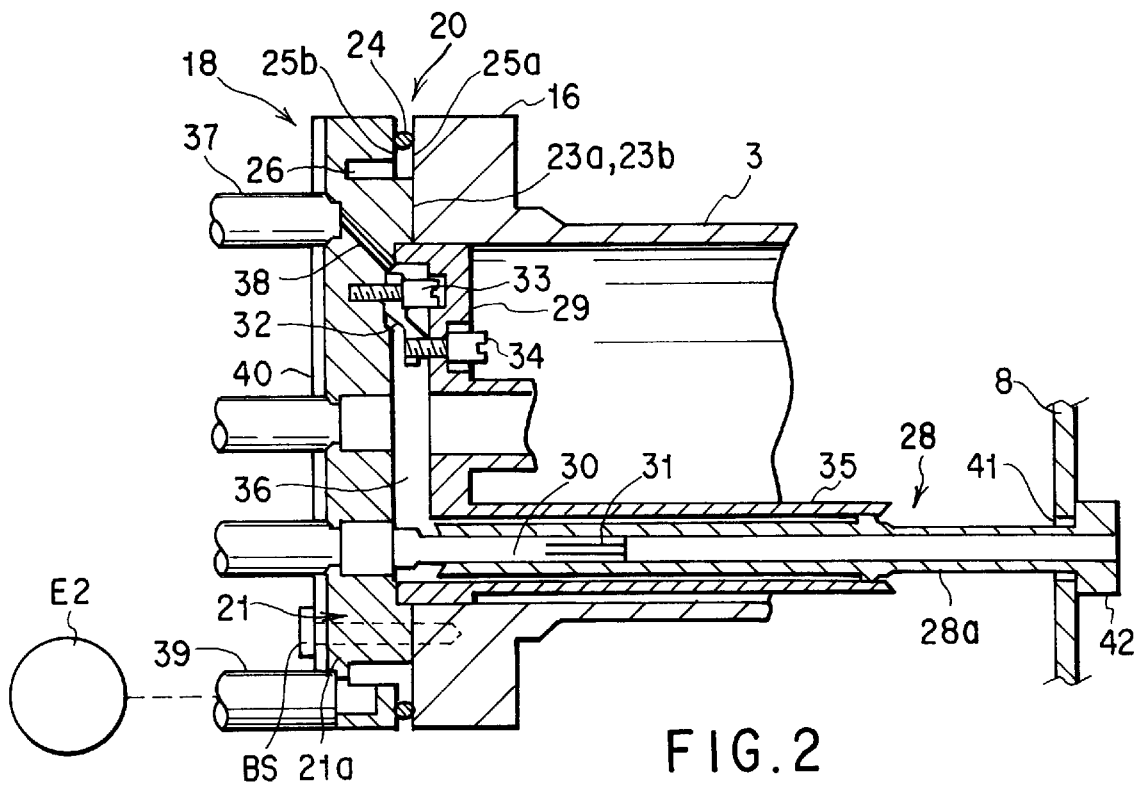
FIG. 2 is an enlarged cross-sectional view showing the part near a gas inlet of the apparatus shown in FIG. 1.

Specifically, as shown in FIG. 2, in order to constitute the first type sealing mechanism 20 on the gas inlet 3 side, the flange 16 is provided with a first mirror surface 23a having an annular or looped shape arranged on the inner side, and a first counter surface 25a having an annular or looped shape arranged around the first mirror surface 23a. Similarly, the flange 21a is provided with a second mirror surface 23b having an annular or looped shape arranged on the inner side, and a second counter surface 25b having an annular or looped shape arranged around the second mirror surface 23b.

The first and second mirror surfaces 23a and 23b each have a surface roughness of Ra (mean surface roughness)= 0.06 $\mu$m or less. The first and second mirror surfaces 23a and 23b face and contact each other to form an inner seal for substantially airtightly sealing the pressure-reduced space within the piping portion P3. The first and second counter surfaces 25a and 25b face each other with a gap therebetween.

In the gap between the first and second counter surfaces 25a and 25b, an O-ring 24 made of, e.g., a fluoride base rubber, is arranged, so that an outer seal is formed by the first and second counter surfaces 25a and 25b and the O-ring 24. An annular or looped buffer space, substantially airtightly closed, is formed between the inner and outer seals. The buffer space is connected through a hole 26 formed in the flange 21 and a pipe 39 to a buffer exhaust unit E2, including a turbo-molecular pump or the like, for exhausting the buffer space and setting it at a pressure-reduced state. This arrangement presents a sealing structure which is highly airtight and entails a low out-gas, i.e., a low gas emission from the O-ring 24, because the O-ring 24 is not exposed to the inside of the process chamber.

Figure 3:
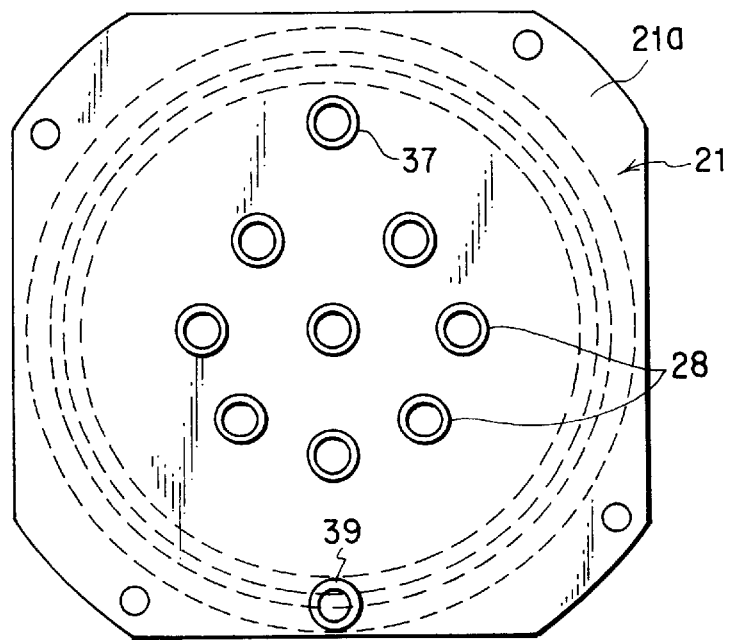
FIG. 3 is a front view showing an end plate of the gas inlet shown in FIG. 2.

As shown in FIGS. 2 and 3, the gas introducing structure 18 is designed such that a plurality of conduits 28 are arranged in the piping portion P3 of the gas inlet 3. The conduits 28 include a plurality of, e.g., 8, conduits 28 for supplying different gases for processes, such as diffusion, CVD, and the like, and a conduit 28 for inserting a thermometer for detecting the temperature in the process chamber 1. Only one piping portion P3 is commonly used for the plurality of conduits 28, the corresponding structure of the process chamber 1 becomes simple. The conduits 28 airtightly penetrate the end plate 21, which is made of a metal, such as stainless steel, of the gas introducing structure 18. The inner surface of the end plate 21 is covered with a corrosion-resistant cover 29 of, e.g., quartz, to protect the end plate 21 from corrosion.

The conduits 28 for supplying process gases are directly connected to the inside of the inner tube 8. Specifically, as shown in FIG. 2, the end plate 21 is provided with gas supply metal nozzles 30, and the quartz pipes 28a fit on the metal nozzles 30 and are connected thereto. Each of the metal nozzles 30 is provided with a plurality of slits 31 at the distal end, so that the distal end comes into contact with the inside of the quartz pipe 28a with a spring-like force.

The corrosion-resistant cover 29 is formed of a circular body having a size to fit on the inside of the piping portion P3 of the gas inlet 3, with the outer edge extending onto the end plate 21. In order to cause the corrosion-resistant cover 29 to fit on the end plate 21, one end of a fixing bar 32 made of a metal, such as stainless steel, is attached to the end plate 21 by a screw 33. The other end of the fixing bar 32 is attached to the corrosion-resistant cover 29 by a screw 34. The corrosion-resistant cover 29 is further provided with sleeves 35 extending in the longitudinal direction of the piping portion P3 to insert the conduits 28 therein, respectively.

In order to prevent a corrosive gas from entering a space 36 between the end plate 21 and the corrosion-resistant cover 29, the end plate 21 is provided with a pipe 37 and a hole 38 for supplying an inactive gas, such as nitrogen ($N_2$), into the space 36. On the outside of the end plate 21, a panel heater 40 capable of heating to a predetermined temperature of, e.g., about 200° C., is arranged to prevent a reaction product from adhering onto the inside of the end plate 21.

The side wall of the inner tube 8 is provide with through holes 41 each of which allows the distal end of the quartz pipe 28a to loosely penetrate therethrough, so as to accommodate a low tolerance of the quartz members while reliably supplying process gases into the inner tube 8. An enlarged portion 42 is arranged at the distal end of the quartz pipe 28a to seal the through hole 41. The enlarged portion 42 is preferably arranged to be in contact with the inside of the inner tube 8, but may be arranged to be in contact with the outside of the inner tube 8.

An annular frame 43 is arranged around the flange 12 of the outer tube 7 to support the outer tube 7. The frame 43 is supported by a base plate 44 through support rods 45. A flange clamp 46 is attached to the frame 43 to fix the flange 12 of the outer tube 7. A heater 47 is arranged on the base plate 44 to surround the process chamber 1 and to heat the inside of the process chamber 1 to a predetermined temperature of, e.g., from about 300° C. to 1000° C., under control.

Between the port 2 at the bottom of the outer tube 7 and the lid 6 for opening and closing the port 2, a sealing mechanism 48 of a second type for ensuring an airtight connection is arranged. The sealing mechanism 48 of the second type is arranged between the flange 12 around the port 2 and a flange 6a of the lid 6 which is mechanically pressed against the flange 12 by the elevating mechanism ME.

Figure 6:
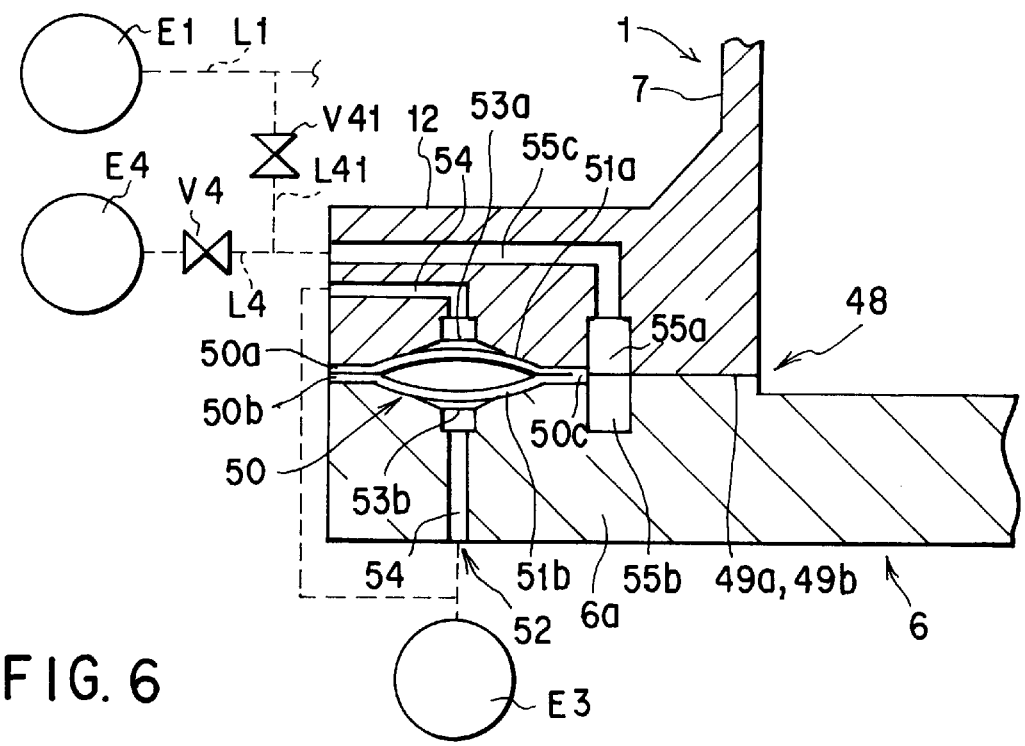
FIG. 6 is an enlarged cross-sectional view showing a sealing mechanism arranged near the port of the process chamber of the apparatus shown in FIG. 1.

Specifically, as shown in FIG. 6, in order to constitute the second type sealing mechanism 48, the flange 12 is provided with a first mirror surface 49a having an annular or looped shape arranged on the inner side, and a first counter surface 51a having an annular or looped shape and a domed cross-section, arranged around the first mirror surface 49a. Similarly, the flange 6a is provided with a second mirror surface 49b having an annular or looped shape arranged on the inner side, and a second counter surface 51b having an annular or looped shape and a domed cross-section, arranged around the second mirror surface 49b.

The first and second mirror surfaces 49a and 49b each have a surface roughness of Ra=0.06 $\mu$m or less. The first and second mirror surfaces 49a and 49b face and contact each other to form an inner seal for substantially airtightly sealing the pressure-reduced space within the process chamber 1. The first and second counter surfaces 51a and 51b face each other with a gap therebetween.

In the gap between the first and second counter surfaces 51a and 51b, a metal sheet member 50 is arranged, so that an outer seal is formed by the first and second counter surfaces 51a and 51b and the metal sheet member 50. The metal sheet member 50 has an annular or looped first sheet 50a in contact with the first counter surface 51a, an annular or looped second sheet 50b in contact with the second counter surface 51b, and an annular or looped connecting portion 50c airtightly connecting the first and second sheets 50a and 50b to each other. The metal sheet member 50 may be fabricated by welding and airtightly connecting the inner edges of the two sheets 50a and 50b, made of stainless steel, to each other to form the connecting portion 50c.

The first and second sheets 50a and 50b are vacuum-stuck onto the first and second counter surface 51a and 51b by a suction mechanism 52. The suction mechanism 52 includes annular or looped suction grooves 53a and 53b formed in the flanges 12 and 6a to have openings corresponding to the first and second sheets 50a and 50b, respectively. The suction grooves 53a and 53b are connected to an exhaust unit E3 including a vacuum pump or the like, through exhausts holes 54 formed in the flanges 12 and 6a, respectively.

An annular or looped buffer grooves 55a and 55b are formed on the inner sides of the first and second counter surface 51a and 51b, respectively. Consequently, an annular or looped buffer space constituted mainly of the annular buffer grooves 55a and 55b and substantially airtightly closed is formed between the inner and outer seals. The buffer space is connected through a hole 55c formed in the flange 12 to a buffer exhaust unit E4, including a turbo-molecular pump or the like, for exhausting the buffer space and setting it at a pressure-reduced state.

As shown in FIG. 6, the buffer exhaust unit E4 of the second type sealing mechanism 48 has an exhaust line L4 which is connected by a bypass L41 to the exhaust line L1 of the main exhaust unit E1 for exhausting the process chamber 1. The bypass L41 is provided with a valve V41 while the exhaust line L4 is provided with a valve V4 immediately before the buffer exhaust unit E4. Consequently, the buffer space of the second type sealing mechanism 48 can be exhausted selectively by either one of the buffer exhaust unit E4 and the main exhaust unit E1, by switching the valves V4 and V41.

Where the process pressure in the process chamber 1 is set at a high vacuum of about $10^{-7}$ Torr, the buffer space (grooves 55a and 55b) is set at a pressure of from about $10^{-4}$ to $10^{-7}$ Torr, and the suction grooves 53a and 53b are set at a pressure of from about 10 to $10^{-2}$ Torr. In this case, the buffer space of the sealing mechanism 48 should be exhausted by the buffer exhaust unit E4. On the other hand, where the process pressure in the process chamber 1 is set at a pressure of from about 100 to 760 Torr near atmospheric pressure, the buffer space (grooves 55a and 55b) is set at a pressure similar to that of the process chamber 1, and the suction grooves 53a and 53b are set at a pressure of from about 10 to $10^{-2}$ Torr. In this case, the buffer space of the sealing mechanism 48 should be exhausted, along with the process chamber 1, by the main exhaust unit E1. With this operation, it becomes unnecessary to delicately control the pressure of the buffer space of the sealing mechanism 48, thereby making the control easier.

On the outside of the flange 12 of the process chamber 1, e.g., on top of the flange clamp 46, and on the outside of the lid 6, e.g., on the bottom, heaters 56 and 57 are arranged, respectively. The heaters 56 and 57 are capable of heating to a predetermined temperature of, e.g., about 300° C. to prevent a reaction product from adhering onto the insides of the flange 12 and the lid 6.

The lid 6 is mounted on the tray 58, which is made of a metal, such as stainless steel and connected to the elevating mechanism ME, because the lid 6 is made of quartz and is easily broken by a locally applied external force. The lid 6 is mounted on the tray 58 and moved with the tray 58 by the elevating mechanism ME in the vertical direction, while the metal sheet member 50 of the second type sealing mechanism 48 and the boat 5 are supported on the lid 6.

Figure 7:
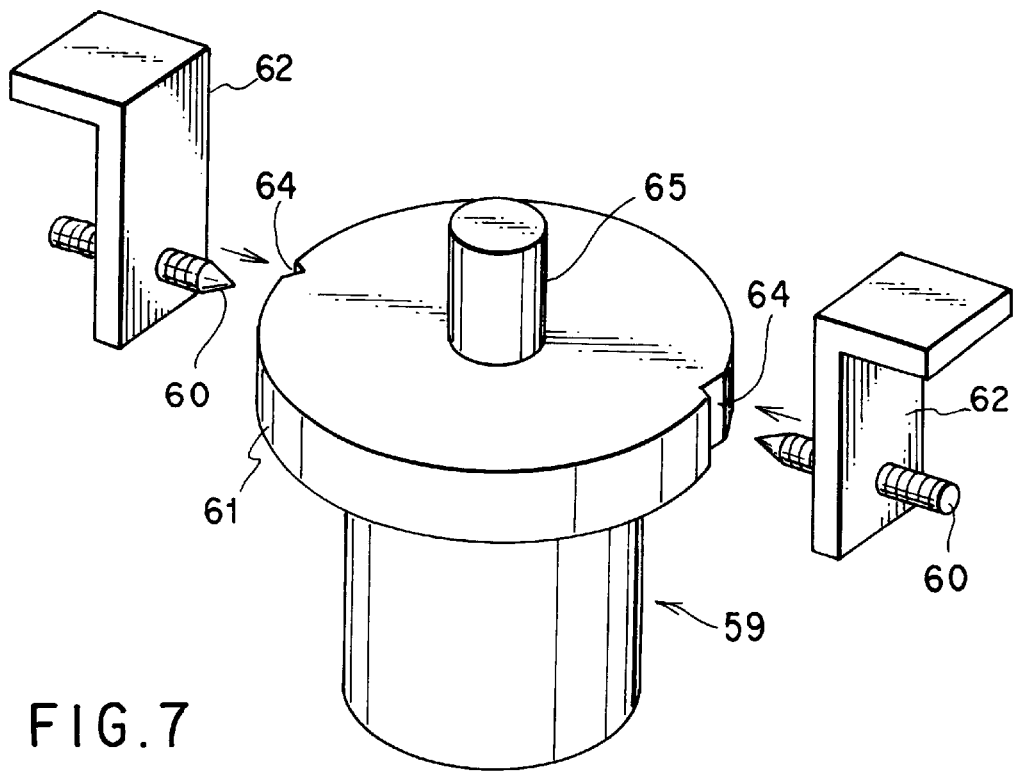
FIG. 7 is a perspective view for explaining the support structure for the rotating mechanism of the apparatus shown in FIG. 1.

A rotational mechanism 59 is arranged at the center of the lid 6, for rotating the boat 5 on a horizontal plane during the heat treatment of the wafers. In order to support the rotational mechanism 59, a plurality of, e.g., two, reverse-L brackets 62 arranged to surround a flange 61 of the rotational mechanism 59 are attached to the bottom of the tray 58. As also shown in FIG. 7, each of the brackets 62 is provided with a screw pin 60 which engages therein to be movable in a radial direction of the flange 61 of the rotational mechanism 59. On the other hand, the flange 61 of the rotational mechanism 59 is provided with vertical grooves 64 into which the tips of the screw pins 60 are inserted. With this arrangement, the rotational mechanism 59 can be precisely fixed at a predetermined position without applying an overload to the lid 6.

The lid 6 is provided with an axial hole 67 into which the rotational axis 65 of the rotational mechanism 59 is inserted, and a boss 68 integrally formed with the lid 6, which is in contact with the top surface of the flange 61 of the rotational mechanism 59. An O-ring 69 is arranged between the boss 68 and the flange 61 of the rotational mechanism 59 for sealing this portion. The rotational axis 65 of the rotational mechanism 59 is connected to a turntable 70 arranged above the lid 6. A labyrinth seal 71 is arranged between the turntable 70 and the lid 6. The boat 5 is mounted on the turntable 70 through an insulating cylinder 72, i.e., an insulating body. The insulating cylinder 72 may be provided with a heater.

An explanation will be given to an operation of the above described heat-treating apparatus.

First, the atmosphere in the process chamber 1 is replaced with an inactive gas, such as $N_2$, so as not to form a natural oxide film on the surface of the wafers W. Then, the process chamber 1 is heated to a predetermined temperature of, e.g., 300° C., by the heater 47 under atmospheric pressure. In this state, the lid 6 is moved up by the elevating mechanism ME, along with the boat 5 holding a number of wafers W, and the metal sheet member 50 of the second type sealing mechanism 48 mounted on the lid 6. When the lid 6 hits the flange 12 of the process chamber 1 to close the port 2 of the process chamber 1, the metal sheet member 50 is placed at a predetermined position in the sealing mechanism 48 and the boat 5 is placed at a predetermined position in the process chamber 1.

Then, the inside of the process chamber 1 is vacuum-exhausted by the main exhaust unit E1 down to a predetermined pressure of, e.g., 0.1 Torr. On the other hand, the suction exhaust unit E3 and the buffer exhaust unit E4 of the sealing mechanism 48 are operated to ensure the seal between the flange 6a of the lid 6 and the flange 12 of the process chamber 1.

Then, the inside of the process chamber 1 is heated to a predetermined process temperature of, e.g., 850° C. by controlling the heater 47, while a predetermined process gas is supplied into the process chamber 1 through the conduits 28, so that a predetermined process, such as CVD, is performed. After the process is finished, the process gas stops being supplied and an inactive gas starts being supplied to set the inside of the process chamber 1 back to atmospheric pressure. At the same time, the inside of the process chamber 1 is cooled to a predetermined temperature of, e.g., 300° C. by controlling the heater 47. When the process chamber 1 returns to atmospheric pressure and room temperature, the lid 6 is opened and the boat 5 is unloaded from the process chamber 1.

As described above, in this heat-treating apparatus, the first type sealing mechanism 20, which allows no O-ring to be exposed to the inside, is arranged at each of the portions connecting the gas inlet 3 and the gas outlet 4 to the gas introducing structure 18 and the exhaust line 19, respectively. Further, the second type sealing mechanism 48, which employs no O-ring, is arranged between the port 2 and the lid 6. Since the sealing mechanisms 20 and 48 have no metal or no O-ring in contact with a process gas, the heat-treating apparatus has a sealed structure with a high heat-resistance, a high corrosion-resistance, a low out-gas, and a strong airtightness. Accordingly, the heat-treating apparatus allows processes, such as oxidation, diffusion, and CVD, to be reliably performed in series in the apparatus, thereby improving the throughput. As a matter of course, the heat-treating apparatus may be used for a single process, instead of serial processes.

The conduits 28 are arranged in the same piping portion P3 of the gas inlet 3. With this arrangement, the conduits 28 are concentrated at one portion to simplify the corresponding part of the process chamber 1. In contrast, in conventional heat-treating apparatuses, gas conduits are connected to a process chamber independently of each other, thereby complicating the corresponding part of the process chamber.

The inner surface of the metal end plate 21 of the gas introducing structure 18 is covered with the corrosion-resistant cover 29. With this arrangement, the inner surface of the end plate 21 is prevented from being corroded, while no metal is exposed to a process gas. The heaters 40, 56, and 57 are arranged on the outside of the flange 12 of the process chamber 1, the lid 6 and the end plate 21. With this arrangement, a reaction product is prevented from adhering onto the insides of these members. Accordingly, a clean process condition is maintained in any process, such as TEOS process or SIN process.

The process chamber 1 has a double-tube structure consisting of the outer and inner tubes 7 and 8, and the seal ring 14 is arranged at the bottom of the annular space 9 between the outer and inner tubes 7 and 8 to seal the annular space 9. With this arrangement, a process gas is not leaked downward from the annular space 9. The side wall of the inner tube 8 is provide with through holes 41 each of which allows the distal end of the quartz pipe 28a of the conduit 28 to loosely penetrate therethrough, while the enlarged portion 42 is arranged at the distal end of the quartz pipe 28a to seal the through hole 41. With this arrangement, it is possible to accommodate a low tolerance of the quartz members while reliably supplying process gases into the inner tube 8.

The lid 6 is mounted on the tray 58 which is provided with the screw pins 60 to fix, from lateral sides, the rotational mechanism 59 for rotating the boat 5. With this arrangement, the rotational mechanism 59 is precisely fixed without applying an overload to the quartz lid 6.

The outer and inner tubes 7 and 8 constituting the process chamber 1 are preferably assembled to be detachable from each other for cleaning. However, since the process chamber 1 may be cleaned with a cleaning gas, the outer and inner tubes 7 and 8 may be integrated by means of, e.g., welding, at the bottom. The process chamber 1 is preferably formed to have a double-tube structure to apply the features of the present invention. However, several features of the present invention may be applied to a process chamber having a single-tube structure, i.e., only an outer tube. Further, other than an apparatus for treating semiconductor wafers, the present invention may be applied to an apparatus for treating glass substrates of LCD substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical heat-treating apparatus for subjecting a plurality of target substrates to a heat treatment at the same time in a semiconductor process system, comprising:

a process tube forming a pressure-reduced process space for accommodating the target substrates, and having a port at a bottom for loading and unloading the target substrates, and a first flange surrounding said port, said first flange being provided with a looped first mirror surface, and a looped first counter surface arranged around said first mirror surface, said first mirror surface having a surface roughness of Ra=0.06 µm or less;

a lid configured to open and close said port, and having a second flange for sealing said process space in cooperation with said first flange, said second flange being provided with a looped second mirror surface, and a looped second counter surface arranged around said second mirror surface, said second mirror surface having a surface roughness of Ra=0.06 µm or less, said first and second mirror surfaces facing and contacting each other to form an inner seal for substantially airtightly sealing said process space, said first and second counter surfaces facing each other with a gap therebetween;

a looped seal member arranged in said gap, and having a looped first sheet in contact with said first counter surface, a looped second sheet in contact with said second counter surface, and a looped connecting portion airtightly connecting said first and second sheets to each other, such that an outer seal is formed by said first and second counter surfaces and said seal member, and a looped buffer space, substantially airtightly closed, is formed between said inner and outer seals;

a suction mechanism configured to vacuum-stick said first and second sheets onto said first and second counter surfaces, respectively, and including suction holes formed in said first and second flanges to have openings corresponding to said first and second sheets, respectively;

a buffer exhaust mechanism configured to exhaust and set said buffer space to a pressure-reduced state;

a holder configured to hold the target substrates to be stacked with a gap therebetween in said process tube, said holder being loaded and unloaded to and from said process tube through said port while holding the target substrates;

an elevating mechanism configured to move up and down said lid along with said holder, said second flange of said lid being pressed against said first flange of said process tube by said elevating mechanism;

a heater configured to heat said process tube and arranged around said process space;

a supply mechanism configured to supply a process gas into said process space; and a main exhaust mechanism configured to exhaust and set said process space to a pressure-reduced state.

2. The apparatus according to claim 1, wherein said connecting portion of said seal member is arranged on inner sides of said first and second sheets.

3. The apparatus according to claim 1, wherein said seal member consists essentially of a metal.

4. The apparatus according to claim 1, wherein said seal member is moved up and down along with said lid by said elevating mechanism.

5. The apparatus according to claim 1, wherein each of said process tube, said lid, and said first and second flanges consists essentially of a material selected from the group consisting of silicon oxide, silicon carbide, zirconium oxide, and aluminum oxide, and said lid is mounted on a tray connected to said elevating mechanism.

6. The apparatus according to claim 5, further comprising a heater configured to heat said lid and arranged on a bottom of said lid.

7. The apparatus according to claim 5, further comprising an inner tube separately formed from said process tube and coaxially arranged in said process tube, wherein said process tube and said inner tube are connected by a bayonet coupling structure, and a space formed between said process tube and said inner tube has a bottom sealed by a ring consisting essentially of a material selected from the group consisting of silicon oxide, silicon carbide, zirconium oxide, and aluminum oxide.

8. The apparatus according to claim 1, further comprising a switching portion configured to selectively connect said buffer space to either one of said buffer exhaust mechanism and said main exhaust mechanism.

9. The apparatus according to claim 1, comprising:

a piping portion having a first part integrally formed with said process tube, and a second part separately formed from said process tube and detachably assemble with said first part to constitute said piping portion, said piping portion being part of either one of said supply mechanism and said main exhaust mechanism;

a member configured to apply a mechanical force to join said first and second parts;

a third flange arranged on said first part, and being provided with a looped third mirror surface, and a looped third counter surface arranged around said third mirror surface, said third mirror surface having a surface roughness of Ra=0.06 $\mu$m or less;

a fourth flange arranged on said second part, and being provided with a looped fourth mirror surface, and a looped fourth counter surface arranged around said fourth mirror surface, said fourth mirror surface having a surface roughness of Ra=0.06 $\mu$m or less, said third and fourth mirror surfaces facing and contacting each other to form a looped inner seal for substantially airtightly sealing a space in said piping portion, said third and fourth counter surfaces facing each other with a gap therebetween;

a looped second seal member arranged in said gap such that a looped outer seal is formed by said third and fourth counter surfaces and said second seal member, and a looped second buffer space, substantially airtightly closed, is formed between said looped inner and looped outer seals; and a second buffer exhaust mechanism configured to exhaust and set said second buffer space to a pressure-reduced state.

10. The apparatus according to claim 9, wherein said second seal member is formed of an O-ring.

11. The apparatus according to claim 9, wherein said piping portion is part of said supply mechanism, and a plurality of gas conduits for supplying different gases are arranged in said piping portion.

12. The apparatus according to claim 11, wherein said second part is formed of a metal end plate for sealing said first part, said end plate has an inner surface covered with a corrosion-resistant cover, and said conduits penetrate said end plate.

13. The apparatus according to claim 11, further comprising an inner tube separately formed from said process tube and coaxially arranged in said process tube, wherein said inner tube has a side wall provided with a through hole which allows a distal end of one of said conduits to loosely penetrate therethrough, and an enlarged portion is arranged at said distal end of said conduit to seal said through hole.

* * * * *